(12) United States Patent
Lee et al.

(10) Patent No.: US 11,026,328 B2
(45) Date of Patent: Jun. 1, 2021

(54) DISPLAY APPARATUS AND MANUFACTURING METHOD THEREOF

(71) Applicant: SAMSUNG ELECTRONICS CO., LTD., Suwon-si (KR)

(72) Inventors: Dong Yeob Lee, Suwon-si (KR); Byung Chul Kim, Suwon-si (KR); Seung Ryong Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/455,050

(22) Filed: Jun. 27, 2019

(65) Prior Publication Data

US 2020/0029436 A1   Jan. 23, 2020

(30) Foreign Application Priority Data

Jul. 19, 2018  (KR) .......................... 10-2018-0083948

(51) Int. Cl.
  *H05K 1/14* (2006.01)
  *H05K 3/38* (2006.01)
  (Continued)

(52) U.S. Cl.
  CPC ............. *H05K 1/142* (2013.01); *H05K 1/181* (2013.01); *H05K 3/386* (2013.01); *H05K 7/04* (2013.01);
  (Continued)

(58) Field of Classification Search
  CPC .......... H05K 1/142; H05K 3/386; H05K 7/04; H05K 1/181; H05K 2201/2018; H05K 2203/0759; H05K 2201/10128; H05K 2201/10106; H05K 2201/10166; H05K 1/0306; H05K 1/0271
  See application file for complete search history.

(56) References Cited

U.S. PATENT DOCUMENTS 8,154,864 B1 * 4/2012 Nearman .............. G09F 9/3026
                                                          361/679.46
9,612,004 B2 * 4/2017 Hemiller .................. F21V 21/34
(Continued)

FOREIGN PATENT DOCUMENTS

JP         4954349 B2     6/2012
KR    10-2013-0011175 A   1/2013
(Continued)

OTHER PUBLICATIONS

International Search Report (PCT/ISA/210) dated Nov. 12, 2019 issued by the International Searching Authority in counterpart International Application No. PCT/KR2019/008622.

*Primary Examiner* — Rockshana D Chowdhury
(74) *Attorney, Agent, or Firm* — Sughrue Mion, PLLC

(57) ABSTRACT

A display apparatus and a manufacturing method thereof are provided. The display apparatus includes a printed circuit board on which a plurality of light emitting diodes (LEDs) is mounted; a frame configured to support the printed circuit board, and including a frame hole passing through the frame; a chassis coupled to the frame, and including a chassis hole configured to correspond to the frame hole; and a bonding member positioned between the printed circuit board and the frame, through the frame hole and the chassis hole, the bonding member configured to bond the frame to the printed circuit board.

18 Claims, 11 Drawing Sheets

(51) Int. Cl.
 *H05K 7/04* (2006.01)
 *H05K 1/18* (2006.01)
(52) U.S. Cl.
 CPC .............. *H05K 2201/10106* (2013.01); *H05K 2201/10128* (2013.01); *H05K 2201/2018* (2013.01); *H05K 2203/0759* (2013.01)

(56) References Cited

U.S. PATENT DOCUMENTS

| | | | |
|---|---|---|---|
| 2011/0219650 A1* | 9/2011 | Wright | G09F 13/22 |
| | | | 40/559 |
| 2012/0113353 A1 | 5/2012 | Kuromizu | |
| 2013/0135539 A1* | 5/2013 | Kamata | G02F 1/133605 |
| | | | 348/790 |
| 2013/0308296 A1 | 11/2013 | Yoo et al. | |
| 2014/0153241 A1* | 6/2014 | Templeton | G09F 9/33 |
| | | | 362/249.02 |
| 2014/0374697 A1* | 12/2014 | Liu | H01L 27/3244 |
| | | | 257/13 |
| 2015/0077643 A1 | 3/2015 | Yamakawa et al. | |
| 2016/0120045 A1 | 4/2016 | Park et al. | |
| 2016/0247983 A1* | 8/2016 | Mutschelknaus | H01L 33/62 |

FOREIGN PATENT DOCUMENTS

| | | |
|---|---|---|
| KR | 10-2013-0127620 A | 11/2013 |
| KR | 10-2016-0048296 A | 5/2016 |

\* cited by examiner

DISPLAY APPARATUS AND MANUFACTURING METHOD THEREOF

CROSS-REFERENCE TO RELATED APPLICATION(S)

This application is based on and claims priority under 35 U.S.C. § 119 to Korean Patent Application No. 10-2018-0083948, filed on Jul. 19, 2018, in the Korean Intellectual Property Office, the disclosure of which is incorporated by reference herein in its entirety.

BACKGROUND

1. Field

The disclosure relates to a display apparatus and a manufacturing method thereof, and more particularly, to a display apparatus having an improved image quality and a manufacturing method thereof.

2. Description of Related Art

A light emitting diode (LED) display apparatus using LEDs has excellent brightness and color characteristics in comparison with other types of display apparatuses (e.g., a liquid crystal display (LCD) type). Therefore, the LED display apparatus is often used for indoor/outdoor billboards, indoor/outdoor signboards, stadium scoreboards or indoor/outdoor backdrops. Further, the LED display apparatus may be easily expanded in the size by arranging the plurality of LEDs in the form of an M×N (M, N are natural numbers) matrix.

With increasing demands for a display apparatus implemented in the form of the M×N matrix, there is an increasing need for a display apparatus which offers easy installation and improved space usability.

When a single display apparatus is configured by combining a plurality of LED modules, a difference in height may occur between LED modules in a manufacturing process. When a difference in height occurs between the LED modules, the color of the edge of the LED module may be distorted. Accordingly, a part of the display image of the display apparatus may be distorted.

SUMMARY

Provided is a display apparatus having an improved image quality, and a method of manufacturing thereof.

Further, provided is a display apparatus capable of preventing a case in which some areas in a display image appear black or a case in which a color of some areas in a display image is distorted, by reducing difference in height between a plurality of printed circuit boards on which a light emitting diode (LED) is mounted, and a method of manufacturing thereof.

Further still, provided is a display apparatus having a reduced manufacturing time and an improved productivity, by reducing a time for adjusting a difference in height between a plurality of printed circuit boards on which a light emitting diode (LED) is mounted, and a method of manufacturing thereof.

Additional aspects will be set forth in part in the description which follows and, in part, will be apparent from the description, or may be learned by practice of the presented embodiments.

In accordance with an aspect of the disclosure, there is provided a display apparatus including: a printed circuit board on which a plurality of light emitting diodes (LEDs) is mounted; a frame configured to support the printed circuit board, and including a frame hole passing through the frame; a chassis coupled to the frame, and including a chassis hole configured to correspond to the frame hole; and a bonding member positioned between the printed circuit board and the frame, through the frame hole and the chassis hole, the bonding member configured to bond the frame to the printed circuit board.

The bonding member may be provided between the printed circuit board and the frame after a chassis assembly having the frame and the chassis coupled to each other is positioned to face the printed circuit board.

The bonding member may include a ultra violet (UV) curable resin, and the bonding member in a liquid state may be injected between the printed circuit board and the frame through the frame hole and the chassis hole.

The bonding member may fill a gap between the printed circuit board and the frame.

The printed circuit board may further include: a substrate including a glass material; and a thin film transistor provided on the substrate and electrically connected to the LED.

A length of the frame in a second direction perpendicular to a first direction, in which the plurality of LEDs emits light, may be less than a length of the printed circuit board in the second direction.

A length of the frame in a third direction perpendicular to the second direction, may be less than a length of the printed circuit board in the third direction.

The frame hole may extend in a second direction perpendicular to a first direction, in which the plurality of LEDs emits light, and a length of the bonding member in a third direction perpendicular to the first direction and the second direction may be greater than a length of the frame hole in the third direction.

The printed circuit board may include a first printed circuit board and a second printed circuit board arranged in a line in a second direction perpendicular to a first direction in which the plurality of LEDs emits light, and the first printed circuit board and the second printed circuit board may not be spaced apart from each other in the first direction.

The frame may include a first frame configured to support the first printed circuit board and a second frame configured to support the second printed circuit board, and a first distance in the first direction between the first printed circuit board and the first frame may be different from a second distance in the first direction between the second printed circuit board and the second frame.

The bonding member may include a first bonding member configured to bond the first printed circuit board to the first frame, and a second bonding member configured to bond the second printed circuit board to the second frame, a length of the first bonding member in the first direction may correspond to the first distance, and a length of the second bonding member in the first direction may correspond to the second distance.

An interval between the plurality of LEDs in a second direction perpendicular to a first direction, in which the plurality of LEDs emits light, may be at least two times greater than an interval between an LED positioned at the end in the second direction among the plurality of LEDs mounted on the printed circuit board and one side of another printed circuit board adjacent to the printed circuit board.

In accordance with an aspect of the disclosure, there is provided display apparatus including: a plurality of printed circuit boards on which a plurality of light emitting diodes (LEDs) is mounted; a chassis configured to cover one surface of the plurality of printed circuit boards; a plurality of frames configured to support the plurality of printed circuit boards, respectively, and coupled to the chassis; and a bonding member configured to bond each of the plurality of printed circuit boards to a corresponding one of the plurality of frames after the plurality of frames is coupled to the chassis.

Each of the plurality of frames may include a plurality of frame holes configured to allow the bonding member to pass through, and the chassis may include a plurality of chassis holes configured to correspond to the plurality of frame holes to allow the bonding member to pass through.

The bonding member may fill a gap between the plurality of printed circuit boards and the plurality of frames.

The plurality of printed circuit boards may include a first printed circuit board and a second printed circuit board arranged in a line in a second direction perpendicular to a first direction in which the plurality of LEDs emits light, and the first printed circuit board and the second printed circuit board may not be spaced apart from each other in the first direction.

The plurality of frames may include a first frame configured to support the first printed circuit board and a second frame configured to support the second printed circuit board, and a distance in the first direction between the first printed circuit board and the first frame may be different from a distance in the first direction between the second printed circuit board and the second frame.

In accordance with an aspect of the disclosure, there is provided a manufacturing method of a display apparatus including: arranging a plurality of printed circuit boards on a jig so that the jig faces the plurality of printed circuit boards, the jig including a jig hole; fixing the plurality of printed circuit boards to the jig by suctioning air through the jig hole; providing a chassis assembly on the plurality of printed circuit boards so that the chassis assembly to faces the plurality of printed circuit boards; injecting a bonding member between the chassis assembly and the plurality of printed circuit boards; and bonding the chassis assembly to the plurality of printed circuit boards by curing the bonding member.

The chassis assembly may include a plurality of frames configured to support the plurality of printed circuit boards and a chassis to which the plurality of frames is coupled.

The chassis assembly may include a hole passing through the chassis assembly, and the bonding member may be injected between the plurality of printed circuit boards and the plurality of frames through the hole of the chassis assembly.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
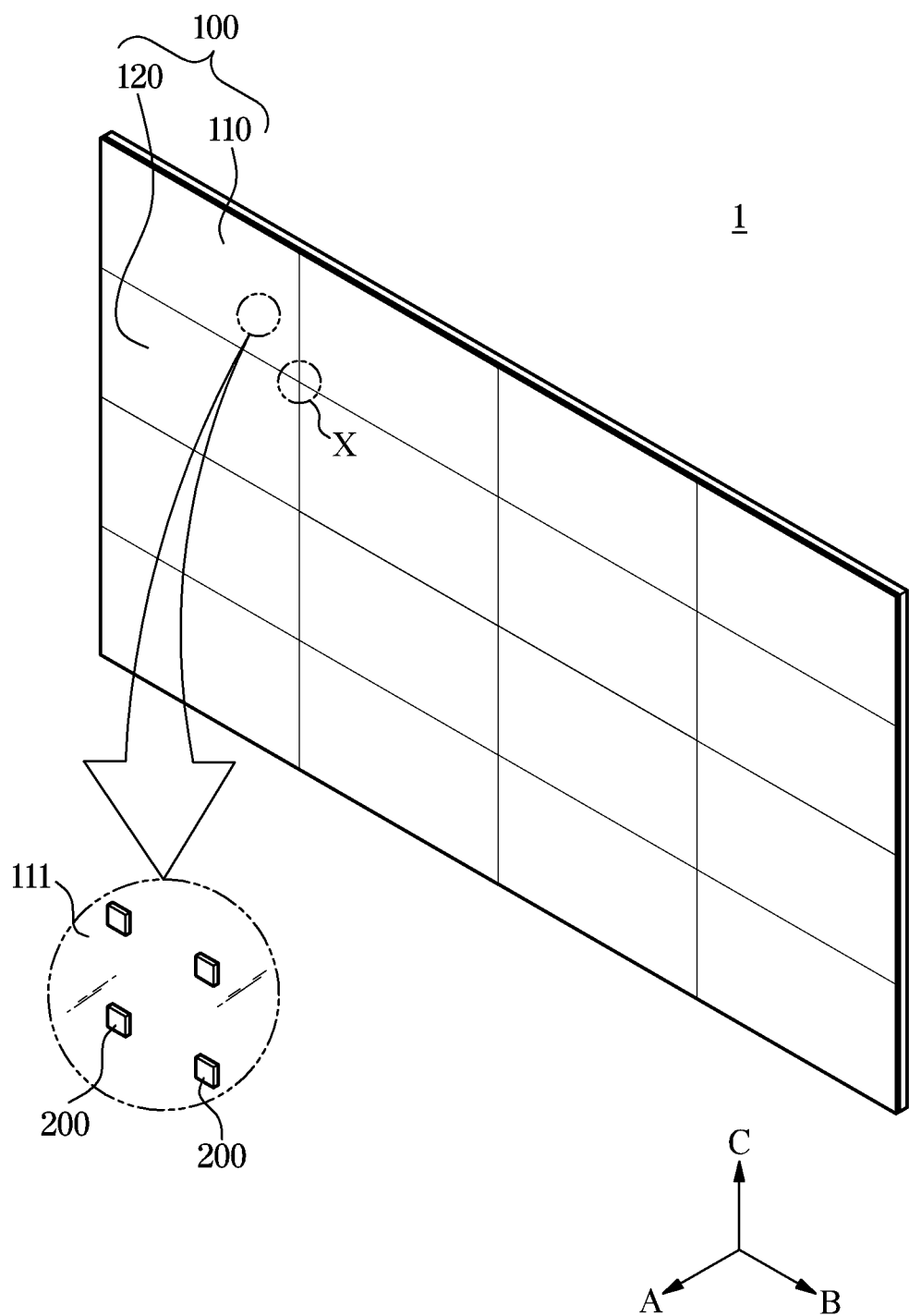
FIG. 1 is a perspective view of a display apparatus according to an embodiment.

Embodiments described in the present disclosure and configurations shown in the drawings are merely examples of the present disclosure, and may be modified in various different ways.

In addition, the same reference numerals or signs shown in the drawings of the present disclosure indicate elements or components performing substantially the same function.

Also, the terms used herein are used to describe the embodiments and are not intended to limit and/or restrict the present disclosure. The singular forms "a," "an" and "the" are intended to include the plural forms as well, unless the context clearly indicates otherwise. In this present disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

It will be understood that, although the terms first, second, third, etc., may be used herein to describe various elements, but elements are not limited by these terms. These terms are only used to distinguish one element from another element. For example, without departing from the scope of the present disclosure, a first element may be termed as a second element, and a second element may be termed as a first element.

The term of "and/or" includes a plurality of combinations of relevant items or any one item among a plurality of relevant items.

Reference will now be made in detail to embodiments with reference to the accompanying drawings.

Figure 2:
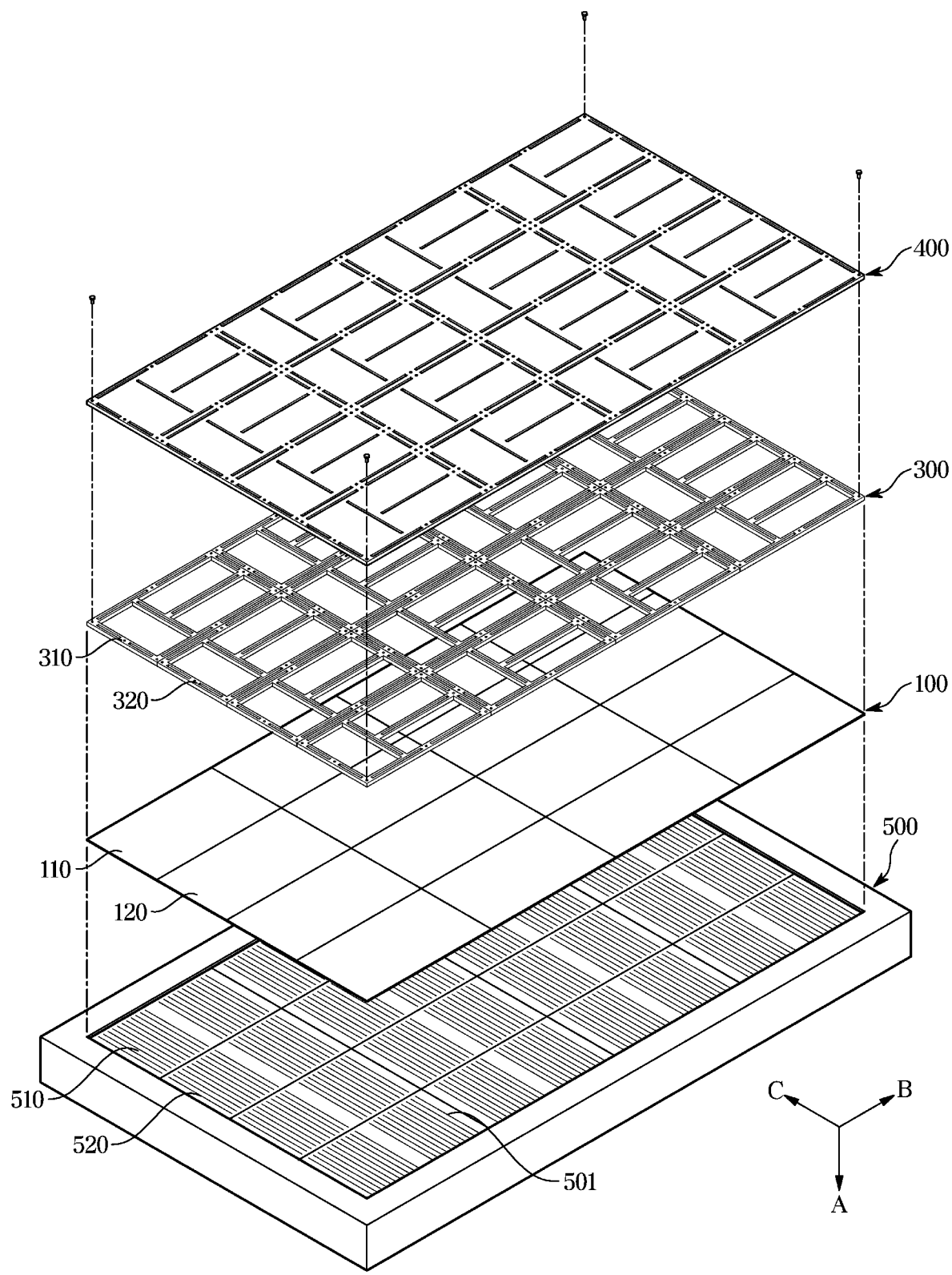
FIG. 2 is an exploded view of the display apparatus according to an embodiment, and illustrates a jig together.
Figure 3:
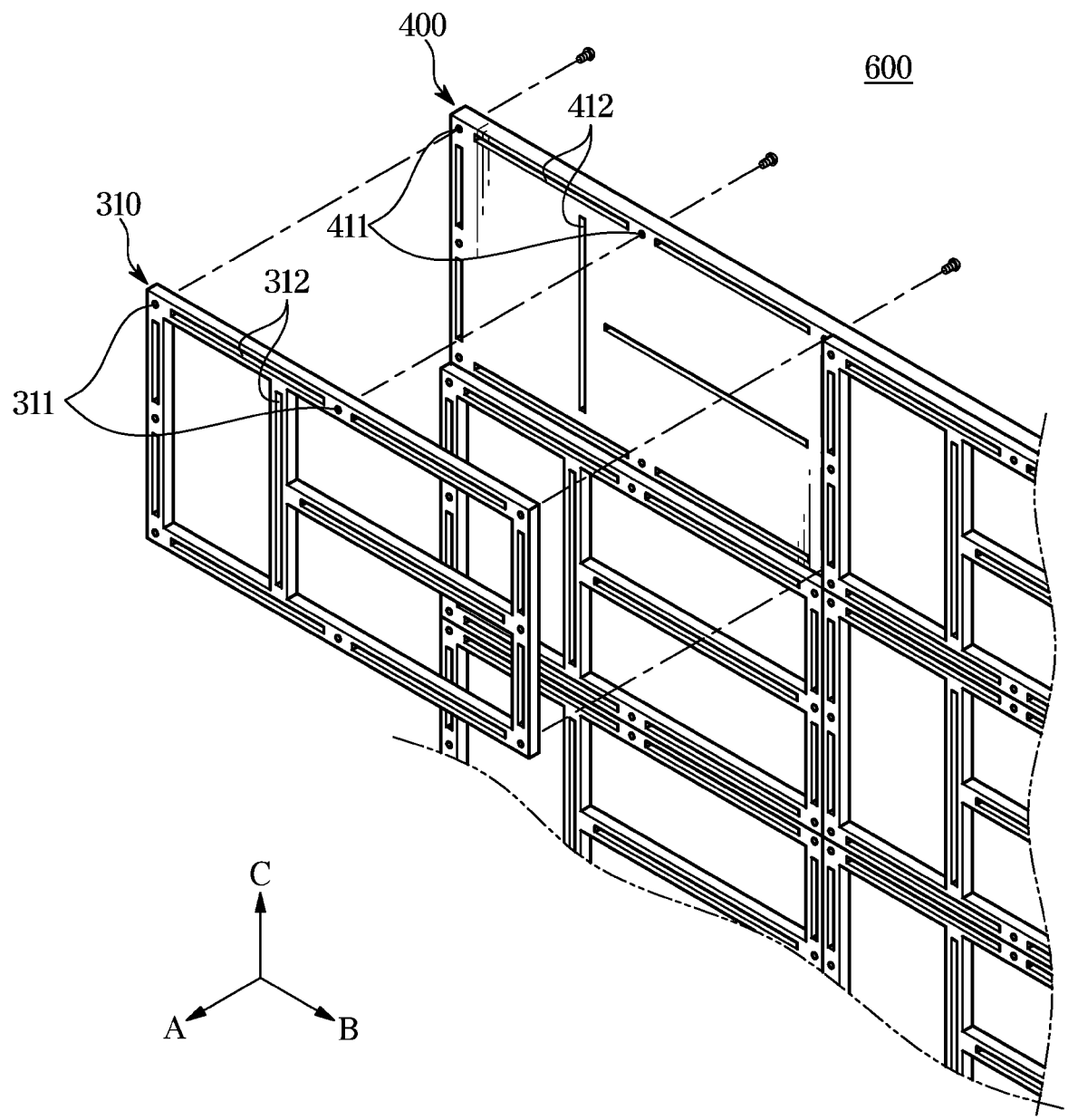
FIG. 3 is a view illustrating a part of a chassis assembly in the display apparatus according to an embodiment.
Figure 4:
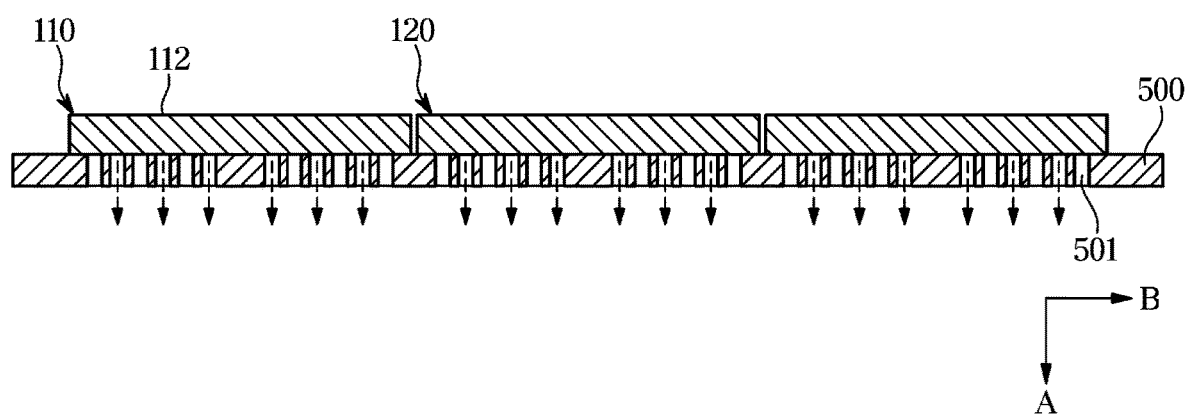
FIG. 4 is a view illustrating a manufacturing process of the display apparatus according to an embodiment.
Figure 5:
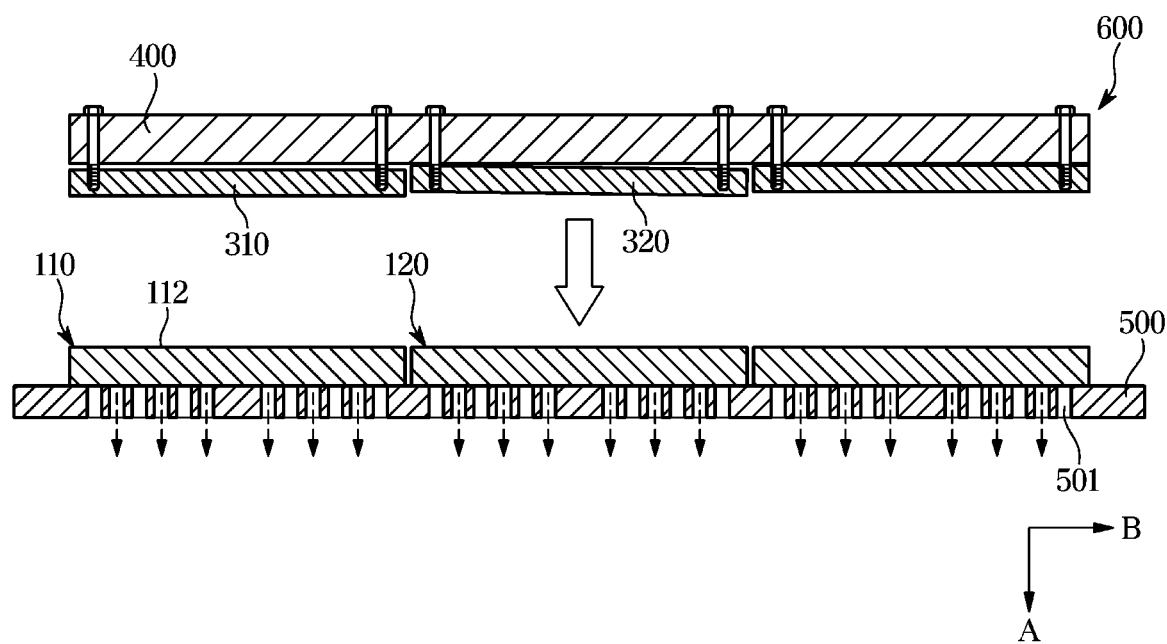
FIG. 5 is a view illustrating a manufacturing process of the display apparatus according to an embodiment.
Figure 6:
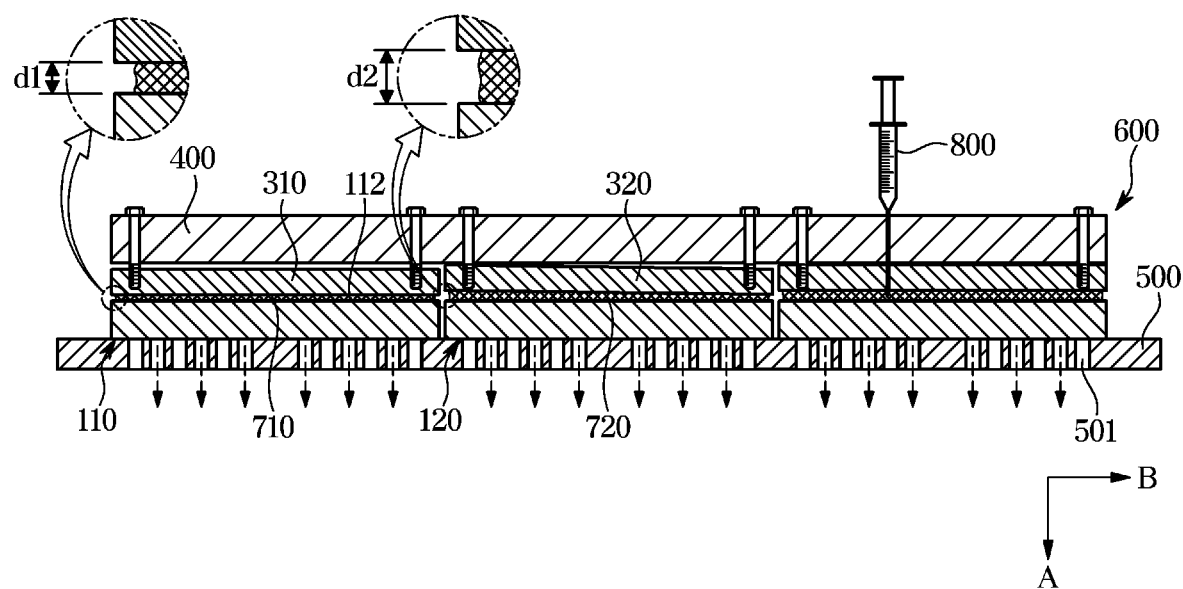
FIG. 6 is a view illustrating a manufacturing process of the display apparatus according to an embodiment.

FIG. 1 is a perspective view of a display apparatus according to an embodiment. FIG. 2 is an exploded view of the display apparatus according to an embodiment, and illustrates a jig together. FIG. 3 is a view illustrating a part of a chassis assembly in the display apparatus according to an embodiment.

A display apparatus 1 may include a plurality of printed circuit boards 100 on which a plurality of LEDs 200 are mounted. The plurality of printed circuit boards 100 may include a first printed circuit board 110 and a second printed circuit board 120. According to the size of the display apparatus 1, the number and/or arrangement of the plurality of printed circuit boards 100 may vary. The size and the ratio of the display apparatus 1 may vary depending on the number and arrangement of the plurality of printed circuit boards 100.

The plurality of LEDs 200 may be mounted on the first printed circuit board 110 and the second printed circuit board 120, respectively. Each of the printed circuit boards 110 and 120 is implemented in the same form, and thus, for convenience of description, only the first printed circuit board 110 will be described below.

The first printed circuit board 110 may include a mounting surface 111 on which the plurality of LEDs 200 may be mounted. The mounting surface 111 may be arranged in a first direction A corresponding to a direction extending outwardly from the display apparatus 1, and the plurality of LEDs 200 arranged on the mounting surface 111 may emit light toward the first direction A.

The plurality of LEDs 200 may be implemented by arranging LEDs, which emit red, green, and blue light, in the form of matrix.

The plurality of LEDs 200 may include a red LED, a green LED, and a blue LED, which may be packaged as a single pixel and in the form of matrix. The red LED, the green LED, and the blue LED that implement one pixel may be referred to as a sub pixel. The pixel may be implemented as an LED emitting white light and a color filter filtering the white light in various colors.

The plurality of LEDs 200 may implement one pixel with the red LED, the green LED, and the blue LED, which may be sub-pixels, and the single pixel may be arranged repeatedly.

The plurality of LEDs 200 may be mounted on the mounting surface 111 in the form of matrix (e.g., M×N, M and N are natural numbers). The matrices may have a square array (e.g., M=N, M, N are natural numbers, 16×16 arrays, 24×24 arrays, etc.) or other arrays (e.g., M≠N, M, N are natural numbers)

The display apparatus 1 may implement a screen by using the plurality of LEDs 200 mounted on the plurality of printed circuit boards 100. Contents may be displayed by driving the plurality of LEDs 200.

When the plurality of LEDs 200 is implemented by micro LEDs, the plurality of printed circuit boards 100 may be formed of glass for the transfer of micro LEDs. More particularly, the plurality of printed circuit boards 100 may include a glass substrate, a thin film transistor arranged on the glass substrate, and the plurality of LEDs 200. The thin film transistor may be electrically connected to the plurality of LEDs 200.

In the case of the plurality of printed circuit boards 100 including a glass material in comparison with a related art printed circuit board, some difficulties may occur as follows.

When the plurality of printed circuit boards 100 include a glass substrate, it may be difficult to install the plurality of printed circuit boards 100 on a chassis 400. A related art printed circuit board, on which a conventional LED is mounted, may be formed of a material, such as an epoxy resin or a phenolic resin or a composite resin. In order to couple a related art printed circuit board with a chassis, a coupling material, such as a stud is coupled to the printed circuit board by soldering and then the printed circuit board is coupled to the chassis through the stud that is coupled to the printed circuit board.

Therefore, when the plurality of printed circuit boards 100 includes a glass substrate, the deformation of the printed circuit board may occur by the high temperature that is generated by soldering the stud, and thus it may be difficult to solder the stud to a correct position.

When the plurality of printed circuit boards is installed in the chassis in a state in which the shape of the printed circuit board is partially deformed or the stud is not placed at the correct position, a difference in height may unintentionally occur among the plurality of printed circuit boards. When the difference in height occurs among the plurality of printed circuit boards, the color of the edge of each of the plurality of printed circuit boards may be distorted by the viewing angle of the LED. For example, the printed circuit board and an area adjacent to the printed circuit board may appear black or may appear in a color different from an intended color. Accordingly, the reliability and/or quality of the display screen may be deteriorated.

Further, when the substrates of the plurality of printed circuit boards 100 are formed of glass, the durability of the printed circuit boards may be lowered in comparison with the related art printed circuit board, and thus when the plurality of panel-shaped printed circuit boards 100 having a thin thickness are mounted on the chassis 400, warpage may occur.

In addition, when the plurality of printed circuit boards 100 is formed of glass, the plurality of printed circuit boards 100 may be damaged due to an impact upon installing the plurality of printed circuit boards 100 on the chassis 400.

Particularly, during the installation of the plurality of printed circuit boards 100, the plurality of printed circuit boards 100 may collide with each other or the plurality of printed circuit boards 100 may collide with the chassis 400, and thus there is a risk of breakage by the collision. More particularly, when the plurality of printed circuit boards 100 is arranged in the form of matrix on the chassis 400, the plurality of printed circuit boards 100 may collide with adjacent printed circuit boards in a process of arranging the plurality of printed circuit boards 100, and thus there is a risk of breakage by the collision.

To solve these problems, the display apparatus 1 may use a jig 500. As such, the plurality of printed circuit boards 100 may be arranged to substantially eliminate a difference in height in the first direction A of the plurality of printed circuit boards 100, and then the chassis 400 and the plurality of frames 300, which are coupled to each other in advance, may be coupled to the rear side of the plurality of printed circuit boards 100. Accordingly, the plurality of frames 300 may stably support the plurality of printed circuit boards 100 while substantially eliminating the difference in height among the plurality of printed circuit boards 100.

Hereinafter, it may be assumed that the plurality of LEDs 200 is micro LEDs as described above, but is not limited thereto. The plurality of LEDs 200 may be conventional LED types. In addition, it may be assumed that the plurality of printed circuit boards 100, on which the micro LEDs are mounted, is in the form of a panel including a glass substrate, but is not limited thereto. The plurality of printed circuit boards 100 may be formed of other materials, such as epoxy resin.

According to an embodiment, the display apparatus 1 may include the plurality of printed circuit boards 100, the plurality of frames 300 provided in a corresponding number of the plurality of printed circuit boards 100, and the chassis 400 to which the plurality of frames 300 is coupled.

The plurality of frames 300 may be primarily coupled to the chassis 400 before being coupled to the plurality of printed circuit boards 100. When the plurality of frames 300 is coupled to the chassis 400, this is it may be collectively referred to as a chassis assembly 600. The chassis assembly 600 may include the chassis 400 and the plurality of frames 300 coupled to the chassis 400.

After the chassis assembly 600 is arranged to face the plurality of printed circuit boards 100, bonding members 710 and 720 may be injected into the plurality of printed circuit boards 100 through a hole formed in the chassis assembly 600. The plurality of printed circuit boards 100 and the chassis assembly 600 may be coupled to each other by curing the bonding members 710 and 720. This will be described later.

The plurality of frames 300 may include a first frame 310 supporting the first printed circuit board 110 and a second frame 320 supporting the second printed circuit board 120. Each of the frames 300 may be implemented in the same form, and thus for convenience of description, only the first frame 310 will be described below.

The first frame 310 may be positioned to face an opposite surface 112 of the mounting surface 111 of the first printed circuit board 110 to support the first printed circuit board 110.

The display apparatus 1 may include an electronic device portion electrically connected to the first printed circuit board 110 to transmit an electrical signal to the first printed circuit board 110 so that an image is displayed on the plurality of LEDs 200. The electronic device portion may be seated in a seating space provided inside the first frame 310. The seating space is an open space that opens outward from inside the frame 310.

The display apparatus 1 may include the chassis 400 to which the plurality of frames 300 are coupled. The chassis 400 may be coupled to the plurality of printed circuit boards 100 through the plurality of frames 300. The chassis 400 may fix the plurality of printed circuit boards 100 by being coupled to the plurality of frames 300.

The first frame 310 may be coupled to the chassis 400 in various ways, such as by screwing, magnetically coupling, or latching. According to an embodiment, the first frame 310 may include a first coupling hole 311, and the chassis 400 may include a second coupling hole 411 screwed to the first coupling hole 311. Accordingly, the first frame 310 and the chassis 400 may be screwed to each other.

As mentioned above, the plurality of frames 300 may be coupled to the chassis 400 and the plurality of frames 300 may be coupled to the plurality of printed circuit boards 100. Each of the plurality of frames 300 and the plurality of printed circuit boards 100 may be coupled to the chassis 400. Therefore, when it is required to replace any one of the plurality of printed circuit boards 100 due to the damage, it is easy to replace any one printed circuit board among the plurality of printed circuit boards 100 by separating the frame and the chassis 400 corresponding to the any one of the plurality of printed circuit boards 100.

As will be described later, the plurality of printed circuit boards 100 may be coupled to the plurality of frames 300 by the bonding members 710 and 720. Therefore, the plurality of printed circuit boards 100 may be coupled to the plurality of frames 300, respectively, without thermal deformation due to high temperature or deformation due to physical pressing.

According to an embodiment, instead of arranging the coupling member component, such as a stud, on a certain area of the plurality of printed circuit boards, the plurality of printed circuit boards 100 may be arranged through the jig 500, in which the plurality of printed circuit boards 100 may be arranged, and each of the plurality of frames 300 coupled to the chassis 400 may be coupled to the plurality of printed circuit boards 100. The jig 500 may be provided in various ways. For example, the jig 500 may include a jig suctioning air through the jig hole 501.

The jig 500 may be configured to allow the plurality of printed circuit boards 100 to be arranged on the jig 500. The jig 500 may be formed in a flat shape to prevent a difference in height in the first direction A. After the plurality of printed circuit boards is positioned on the upper surface of the jig 500, the jig 500 may suction air through a plurality of jig holes 501 provided in the jig 500 by opening a valve. When air is suctioned through the jig hole 501, a gap between the plurality of printed circuit boards 100 positioned on the upper surface of the jig 500, and the jig 500 may be substantially eliminated. As described above, because the jig 500 is provided in a flat shape, each of the plurality of printed circuit boards 100 arranged in the jig 500 may be fixed in a flat state. Therefore, when the plurality of printed circuit boards 100 is arranged in the jig 500, there is no substantial difference in height among the plurality of printed circuit boards 100. When the chassis assembly 600 is coupled to the plurality of printed circuit boards 100 in the above mentioned arrangement, and the arrangement is maintained after the chassis assembly 600 is coupled to the plurality of printed circuit boards 100, an image, which is implemented by the plurality of printed circuit boards 100, may be displayed without the distortion. Therefore, the image quality of the display apparatus 1 may be improved.

As described above, the plurality of frames 300 may support the plurality of the printed circuit boards 100 while being in contact with the opposite surfaces of the mounting surface of the plurality of printed circuit boards 100. The plurality of frames 300 may be formed in a flat shape and formed of a material that is not easily deformed. The plurality of frames 300 may prevent warpage of the plurality of printed circuit boards 100 by supporting the plurality of printed circuit boards 100. In addition, the plurality of frames 300 may improve the durability of the plurality of printed circuit boards 100 by preventing the warpage and torsion of the plurality of printed circuit boards 100.

FIGS. 4, 5, 6, and 7 are views illustrating a manufacturing process of the display apparatus according to an embodiment.

According to a method of manufacturing a display apparatus according to an embodiment, the plurality of printed circuit boards 100 may be arranged on the jig 500 including the jig hole 501 in such a way that the jig 500 faces the plurality of printed circuit boards 100. The plurality of printed circuit boards 100 may include the first printed circuit board 110 and the second printed circuit board 120. For convenience of description, the first printed circuit board 110 and the second printed circuit board 120 will be described.

When the first printed circuit board 110 and the second printed circuit board 120 are arranged in the jig 500, the first printed circuit board 110 and the second printed circuit board 120 may be spaced apart from each other by a predetermined distance. This is because the first printed circuit board 110 and the second printed circuit board 120 may be easily damaged by the contact because the first printed circuit board 110 and the second printed circuit board 120 are fragile as described above.

After the first printed circuit board 110 and the second printed circuit board 120 are arranged on the jig 500, air may be suctioned via the jig hole 501 by opening the valve. Based on the air suctioned via the jig hole 501, a gap between the first printed circuit board 110 and the jig 500, and between the second printed circuit board 120 and the jig 500 may be substantially eliminated. Further, the first printed circuit board 110 and the second printed circuit board 120 may be fixed to the jig 500. Accordingly, the first printed circuit board 110 and the second printed circuit board 120 may be fixed to the jig 500 with a predetermined gap in a second direction B perpendicular to the first direction.

In a state in which the first printed circuit board 110 and the second printed circuit board 120 are fixed to the jig 500, the chassis assembly 600 may be coupled to the first printed circuit board 110 and the second printed circuit board 120.

As described above, the chassis assembly 600 may include the chassis 400, and the first frame 310 and second frame 320 coupled to the chassis 400. The chassis assembly 600 may be coupled in advance. The chassis assembly 600 may be coupled only before it is arranged to face the plurality of printed circuit boards 100, and thus the time point at which the coupling is made may be varied. For example, the chassis 400 and the plurality of frames 300 may be coupled to each other before the plurality of the print circuit boards 100 is positioned on the jig 500, or the chassis 400 and the plurality of frames 300 may be coupled to each other after the plurality of the print circuit boards 100 is fixed to the jig 500.

The chassis assembly 600 may be positioned to face the first printed circuit board 110 and the second printed circuit board 120. More particularly, the chassis assembly 600 may be positioned in such a way that the first frame 310 faces the opposite surface 112 of the mounting surface of the first printed circuit board 110.

When the chassis assembly 600 is positioned to face the plurality of printed circuit boards 100, a gap may be formed between the plurality of frames 300 and the plurality of printed circuit boards 100. As the plurality of printed circuit boards 100 is fixed to the jig 500, a difference in height may be reduced in the first direction A. On the other hand, each of the plurality of frames 300 coupled to the chassis 400 may have a different distance in the first direction A with respect to the chassis 400. That is, the plurality of frames 300 may have a difference in height with respect to the chassis 400. The chassis 400 may be formed in a flat shape. Accordingly, a distance d1 in the first direction A between the first printed circuit board 110 and the first frame 310, and a distance d2 in the first direction A between the second printed circuit board 120 and the second frame 320 may be different from each other.

After the chassis assembly 600 is arranged to face the plurality of printed circuit boards 100, the bonding members 710 and 720 may be injected between the plurality of printed circuit boards 100 and the plurality of frames 300 through a chassis hole 412 and a frame hole 312 described later. The bonding members 710 and 720 may be formed of a UV curable resin. Accordingly, the bonding members 710 and 720 in a liquid state may be injected between the plurality of printed circuit boards 100 and the plurality of frames 300 through a dispenser 801.

A viscosity of the liquid UV curable resin may be equal to or greater than 10,000 cP (centi_Poise). When the viscosity of the liquid bonding members 710 and 720 is too small, the bonding members 710 and 720 may flow into the gap in the second direction between the first printed circuit board 110 and the second printed circuit board 120. When the bonding members 710 and 720 are irradiated by ultraviolet (UV) light after the bonding members 710 and 720 flow to the gap, the first printed circuit board 110 and the second printed circuit board 120 may be coupled to each other by the bonding members 710 and 720. For example, in a state in which the first printed circuit board 110 and the second printed circuit board 120 are coupled to each other, and when only the first printed circuit board 110 is separated from the chassis 400 or only the second printed circuit board 120 is separated from the chassis 400, the first printed circuit board 110 and the second printed circuit board 120 may break. Therefore, the viscosity of the bonding members 710 and 720 may be set to 10,000 cP (centi_Poise) or more.

The bonding members 710 and 720 may include a first bonding member 710 bonding the first printed circuit board 110 to the first frame 310 and a second bonding member 720 bonding the second printed circuit board 120 to the second frame 320. The first bonding member 710 in a liquid state may be injected between the first printed circuit board 110 and the first frame 310 to fill a gap, which may be formed between the first printed circuit board 110 and the first frame 310. The second bonding member 720 in a liquid state may be injected between the second printed circuit board 120 and the second frame 320 to fill a gap, which may be formed between the second printed circuit board 120 and the second frame 320.

As mentioned above, the distance d1 between the first printed circuit board 110 and the first frame 310 and the distance d2 between the second printed circuit board 120 and the second frame 320 may be different from each other. The gap may not be generated between the first printed circuit board 110 and the first frame 310. In this case, the first bonding member may not be provided between the first printed circuit board 110 and the first frame 310. When the distance d1 between the first printed circuit board 110 and the first frame 310 is different from the distance d2 between the second printed circuit board 120 and the second frame 320, a height of the first bonding member 710 filling the gap between the first printed circuit board 110 and the first frame 310 may be different from a height of the second bonding member 720 filling the gap between the second printed circuit board 120 and the second frame 320. Because the first bonding member 710 and the second bonding member 720 fill the different size gap, an interval between the plurality of printed circuit boards 100 and the chassis 400 may be constant although an interval between the chassis 400 and the plurality of the frame 300 is different. In other words, although the distance d1 between the first printed circuit board 110 and the first frame 310 is different from the distance d2 between the second printed circuit board 120 and the second frame 320, a distance between the first printed circuit board 110 and the chassis 400 may be practically identical to the distance between the second printed circuit board 120 and the chassis 400.

After the bonding members 710 and 720 are injected, the plurality of printed circuit boards 100 and the chassis assembly 600 may be coupled by curing the bonding members 710 and 720 in a liquid state.

Figure 7:
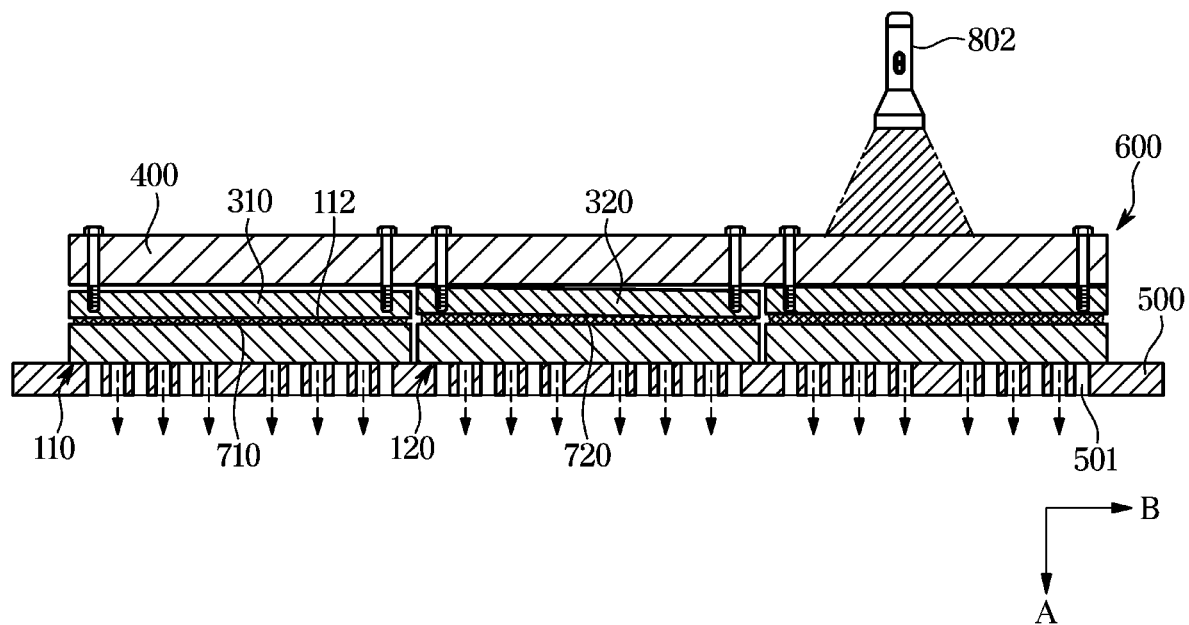
FIG. 7 is a view illustrating a manufacturing process of the display apparatus according to an embodiment.

As illustrated in FIG. 7, after the bonding members 710 and 720 are applied, UV light is radiated thereto, and thus each of the plurality of the printed circuit boards 100 may adhere to a corresponding one of the plurality of the frames 300. The bonding members 710 and 720 filled in the gap between each of the plurality of the printed circuit boards 100 and the plurality of the frames 300 may be cured by being irradiated directly with the UV light or by being irradiated with the UV light reflected by the plurality of the printed circuit boards 100. Particularly, the bonding members 710 and 720 may be cured by the UV reflection occurring in a thin film transistor. When the bonding members 710 and 720 are cured, the plurality of the printed circuit boards 100 and the plurality of frames 300 may be coupled to each other. Accordingly, the plurality of printed circuit boards 100 and the chassis 400 may be coupled to each other. In addition, it is possible to separate the plurality of printed circuit boards 100 from the jig 500 by closing a valve after the plurality of printed circuit boards 100 and the chassis 400 are coupled to each other.

The display apparatus according to an embodiment may be manufactured through the above process.

Figure 8:
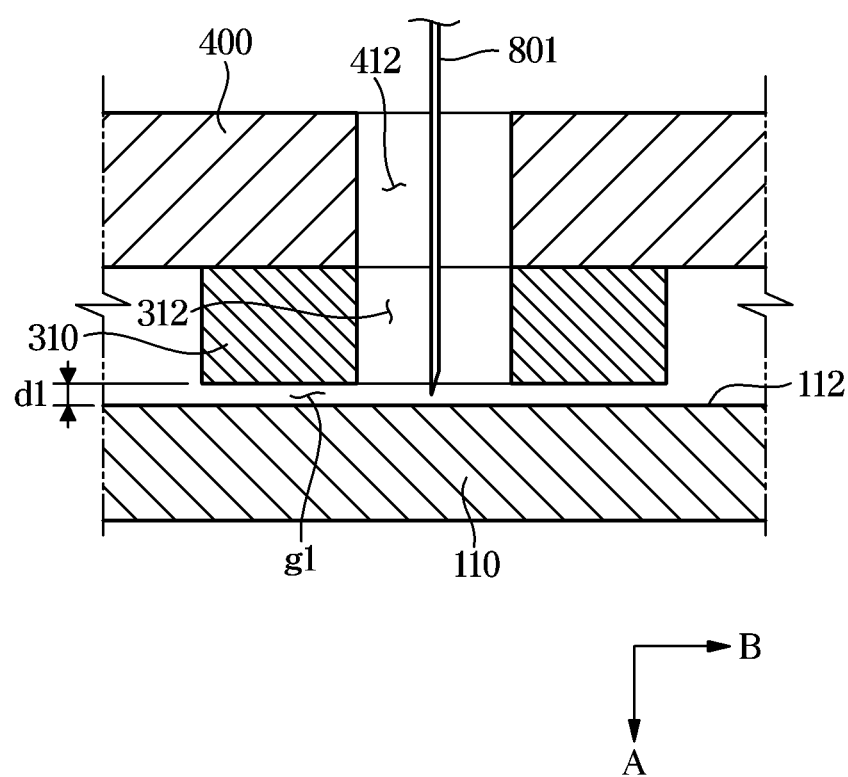
FIG. 8 is a side cross-sectional view of the display apparatus before injection of bonding member according to an embodiment.
Figure 9:
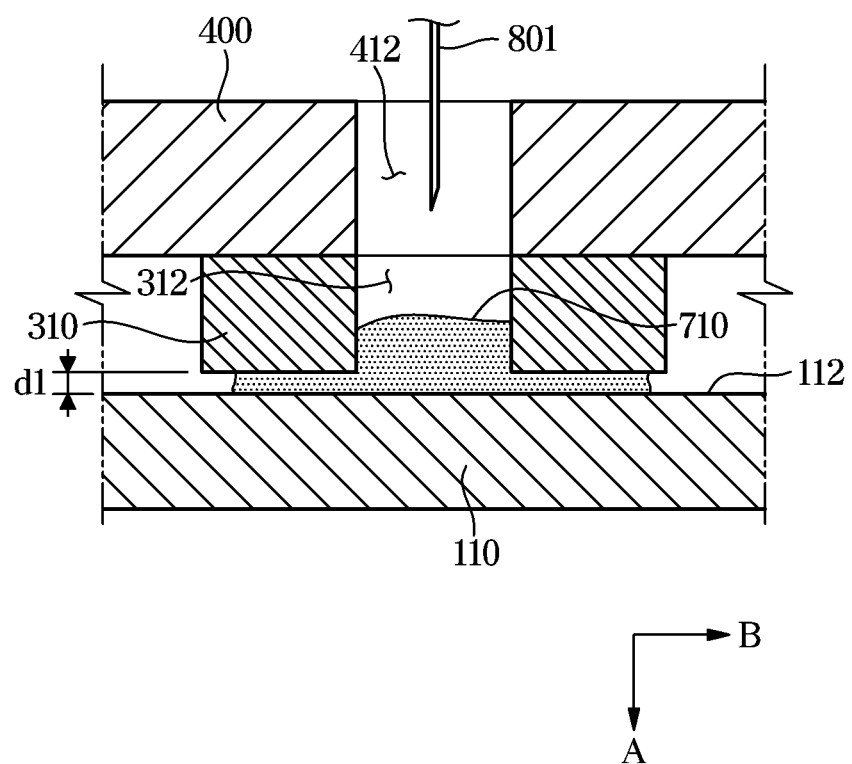
FIG. 9 is a side cross-sectional view of the display apparatus after the injection of the bonding member according to an embodiment.

FIG. 8 is a side cross-sectional view of the display apparatus before injection of bonding member according to an embodiment. FIG. 9 is a side cross-sectional view of the display apparatus after the injection of the bonding member according to an embodiment.

Referring to FIGS. 8 and 9, the first bonding member 710 may be injected to the first printed circuit board 110 through the chassis holes 412 and the frame hole 312. More particularly, after the dispenser 801 moves to the chassis hole 412 or the frame hole 312 in the first direction A, the first bonding member 710 may be injected into the first printed circuit board 110.

As mentioned above, before the first bonding member 710 is injected, the plurality of frames 300 may be coupled to the chassis 400. The first bonding member 710 may fill at least a portion of a gap g1 between the first printed circuit board 110 and the first frame 310.

Figure 10:
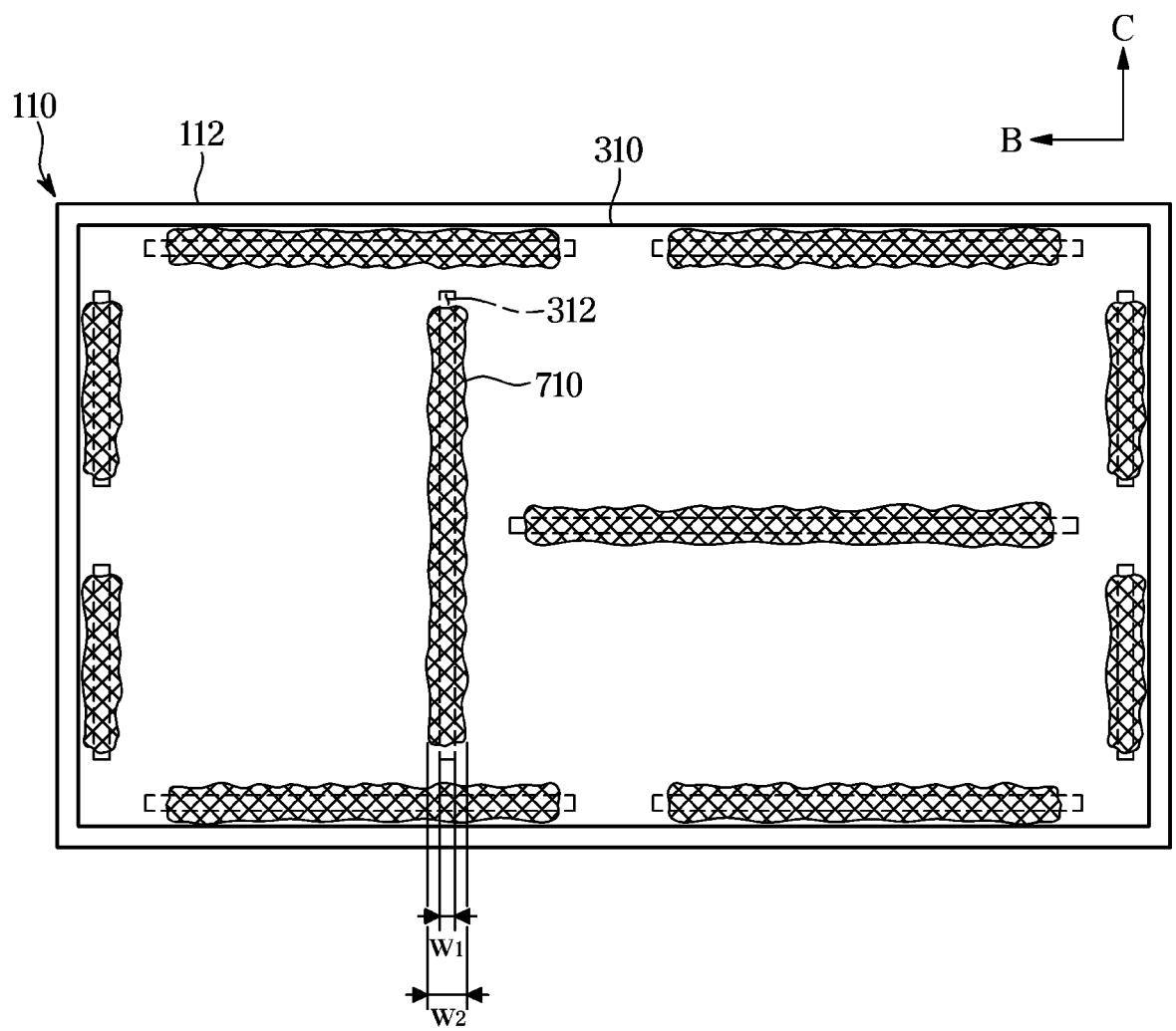
FIG. 10 is a plane view of a printed circuit board, a frame and a bonding member in the display apparatus according to an embodiment.

FIG. 10 is a plane view of a printed circuit board, a frame and a bonding member in the display apparatus according to an embodiment.

Referring to FIG. 10, the first frame 310 may be smaller than the first printed circuit board 110. More particularly, a length of the first frame 310 in the second direction B may be less than a length of the first printed circuit board 110 in the second direction B. In addition, a length of the first frame 310 in a third direction C may be less than a length of the first printed circuit board 110 in the third direction C. Here, the third direction C is a direction extending vertically with respect to the display apparatus and perpendicular to the direction A and direction B.

When the chassis assembly 600, in which the plurality of frames 300 is coupled to the chassis 400, is coupled to the plurality of printed circuit boards 100, a certain tolerance or error may occur in the second direction B and/or the third direction C. The first frame 310 may be equal to or greater than the first printed circuit board 110. In such case, when the chassis assembly 600 is coupled to the plurality of printed circuit boards 100, an error or tolerance may occur, and thus, the first frame 310 may be coupled to the second printed circuit board 120 adjacent to the first printed circuit board 110 as well as the first printed circuit board 110. In this case, when the first printed circuit board 110 is separated from the chassis 400, the second printed circuit board 120 may be broken. Accordingly, the first frame 310 may be smaller than the first printed circuit board 110 in the second direction B and the third direction C.

As illustrated in FIG. 10, when the frame hole 312 extends in the third direction C, a length w2 of the first bonding member 710 in the second direction B may be greater than a length w1 of the frame hole 312 in the second direction B. As mentioned above, this is because the first printed circuit board 110 and the first frame 310 have a gap in the first direction, and the first bonding member 710 fills at least a part or entire of the gap.

In addition, a length of the first bonding member 710 in the third direction C may be greater than a length of the frame hole 312 in the third direction C.

Figure 11:
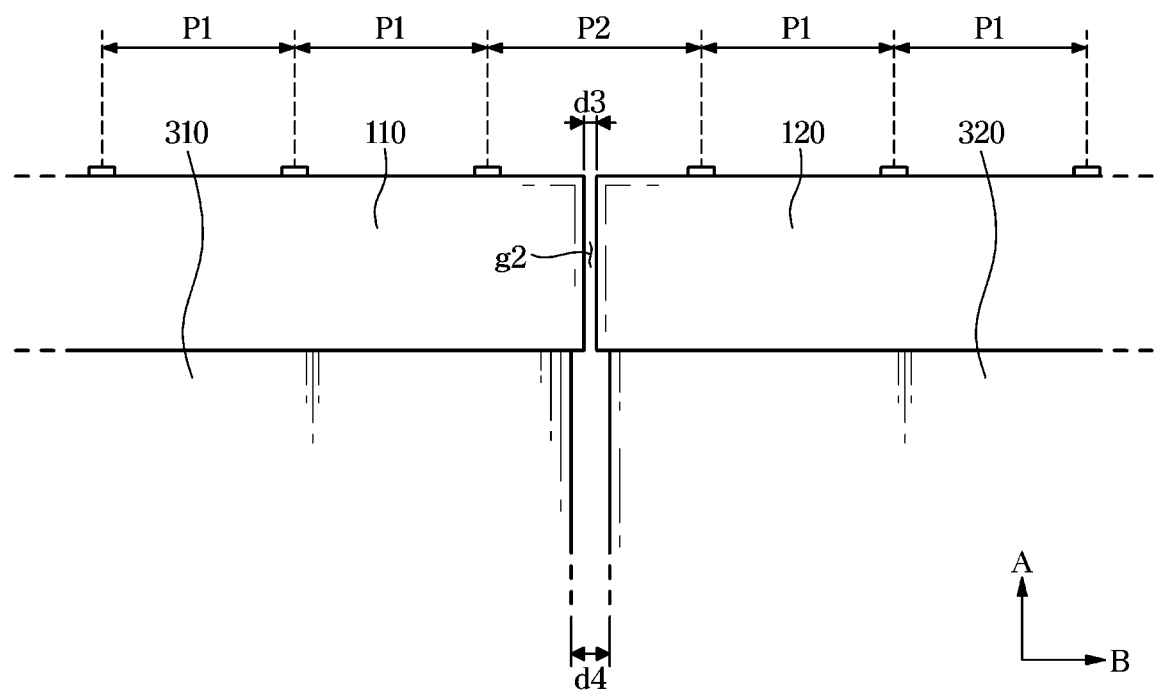
FIG. 11 is a side cross-sectional view of some components in the display apparatus according to an embodiment.

FIG. 11 is a side cross-sectional view of some components in the display apparatus according to an embodiment.

As illustrated in FIG. 11, it may be assumed that an interval among the plurality of LEDs 200 mounted on the plurality of printed circuit boards 100 is interval P1, and an interval P2 may be an interval between one LED on the first printed circuit board 110 and one LED on the second printed circuit board 120. The interval P2 may be practically identical to P1 when the LED on the first printed circuit board 110 is the closest to a side adjacent to the second printed circuit board 120 in the second direction B, among the plurality of LEDs 200 mounted on the first printed circuit board 110 and the LED on the second printed circuit board 120 is the closest to a side adjacent to the first printed circuit board 110 in the second direction B, among the plurality of LEDs 200 mounted on the second printed circuit board 120.

For example, a length of P1 may be approximately 100 micrometers, a distance d3 in the second direction B between the first printed circuit board 110 and the second printed circuit board 120 may be approximately 20 micrometers. Further, a distance between the first printed circuit board 110 and the LED mounted on the second printed circuit board 120 closest to the first printed circuit board 110 may be approximately 40 micrometers. Similarly, a distance between the second printed circuit board 120 and the LED mounted on the first printed circuit board 110 closest to the second printed circuit board 120 may be approximately 40 micrometers. In other words, the interval P1 among the plurality of LEDs mounted on the plurality of printed circuit boards 100 may be at least two times greater than the interval between the first printed circuit board 110 and the LED mounted on the second printed circuit board 100 closest to the first printed circuit board 110. This is to make the lengths of P1 and P2 substantially the same although the interval d3 is generated between the first printed circuit board 110 and the second printed circuit board 120.

As mentioned above, when the plurality of printed circuit boards 100 are arranged on the chassis 400, the interval among the plurality of LEDs may be all the same because the length of P1 is substantially the same as the length of P2.

Accordingly, when the plurality of printed circuit boards 100 are arranged on the chassis 400, a separation distance among the plurality of printed circuit boards 100 may be the interval d3 and the plurality of frames 300 may be positioned to be in contact with each other without the separation distance.

As mentioned above, because the first frame 310 is smaller than the printed circuit board 110 and the second frame 320 is smaller than the second printed circuit board 120, an interval d4 in the second direction B between the first frame 310 and the second frame 320 may be greater than the interval d3 in the second direction B the first printed circuit board 110 and the second printed circuit board 120.

According to one or more embodiments described herein, it is possible to provide the display apparatus having the improved image quality and the manufacturing method thereof.

It is possible to prevent a case in which some areas in a display image appear black or a case in which a color of some areas in a display image is distorted, by reducing a difference in height between a plurality of printed circuit boards on which a light emitting diode (LED) is mounted.

It is possible to reduce a manufacturing time and to improve productivity, by reducing a time for adjusting a difference in height between the plurality of printed circuit boards on which the LED is mounted.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. A display apparatus comprising:
   a printed circuit board on which a plurality of light emitting diodes (LEDs) is mounted;
   a frame configured to support the printed circuit board, and including a frame hole passing through the frame;
   a chassis coupled to the frame, and including a chassis hole configured to correspond to the frame hole; and
   a bonding member positioned between the printed circuit board and the frame, through the frame hole and the chassis hole, the bonding member configured to bond the frame to the printed circuit board, and
   wherein the frame and the chassis are coupled by a screw,
   wherein the bonding member in a liquid state is injected between the printed circuit board and the frame through the frame hole and the chassis hole, and
   wherein the frame hole extends in a second direction perpendicular to a first direction, in which the plurality of LEDs emits light, and a length of the bonding member in a third direction perpendicular to the first direction and the second direction is greater than a length of the frame hole in the third direction.

2. The display apparatus of claim 1, wherein the bonding member is provided between the printed circuit board and the frame after a chassis assembly having the frame and the chassis coupled to each other is positioned to face the printed circuit board.

3. The display apparatus of claim 1, wherein the bonding member comprises a ultra violet (UV) curable resin.

4. The display apparatus of claim 1, wherein the bonding member fills a gap between the printed circuit board and the frame.

5. The display apparatus of claim 1, wherein the printed circuit board comprises:
   a substrate comprising a glass material; and
   a thin film transistor provided on the substrate and electrically connected to the LED.

6. The display apparatus of claim 1, wherein a length of the frame in the second direction perpendicular to the first direction, in which the plurality of LEDs emits light, is less than a length of the printed circuit board in the second direction.

7. The display apparatus of claim 6, wherein a length of the frame in the third direction perpendicular to the second direction, is less than a length of the printed circuit board in the third direction.

8. The display apparatus of claim 1, wherein the printed circuit board comprises a first printed circuit board and a second printed circuit board arranged in a line in the second direction perpendicular to the first direction in which the plurality of LEDs emits light, and the first printed circuit board and the second printed circuit board are not spaced apart from each other in the first direction.

9. The display apparatus of claim 8, wherein the frame comprises a first frame configured to support the first printed circuit board and a second frame configured to support the second printed circuit board, and
   wherein a first distance in the first direction between the first printed circuit board and the first frame is different from a second distance in the first direction between the second printed circuit board and the second frame.

10. The display apparatus of claim 9, wherein the bonding member comprises a first bonding member configured to bond the first printed circuit board to the first frame, and a second bonding member configured to bond the second printed circuit board to the second frame,
    wherein a length of the first bonding member in the first direction corresponds to the first distance, and
    a length of the second bonding member in the first direction corresponds to the second distance.

11. The display apparatus of claim 1, wherein an interval between the plurality of LEDs in the second direction perpendicular to the first direction, in which the plurality of LEDs emits light, is at least two times greater than an interval between an LED positioned at an end in the second direction among the plurality of LEDs mounted on the printed circuit board and one side of another printed circuit board adjacent to the printed circuit board.

12. A display apparatus comprising:
    a plurality of printed circuit boards on which a plurality of light emitting diodes (LEDs) is mounted;
    a chassis configured to cover one surface of the plurality of printed circuit boards;
    a plurality of frames configured to support the plurality of printed circuit boards, respectively, and coupled to the chassis; and
    a bonding member configured to bond each of the plurality of printed circuit boards to a corresponding one of the plurality of frames after the plurality of frames is coupled to the chassis,
    wherein the frame and the chassis are coupled by a screw, and
    wherein the plurality of printed circuit boards comprises a first printed circuit board and a second printed circuit board arranged in a line in a second direction perpendicular to a first direction in which the plurality of LEDs emits light,
    wherein the plurality of frames comprises a first frame configured to support the first printed circuit board and a second frame configured to support the second printed circuit board, and
    wherein a first distance in the first direction between the first printed circuit board and the first frame is different from a second distance in the first direction between the second printed circuit board and the second frame.

13. The display apparatus of claim 12, wherein each of the plurality of frames comprises a plurality of frame holes configured to allow the bonding member to pass through, and
    the chassis comprises a plurality of chassis holes configured to correspond to the plurality of frame holes to allow the bonding member to pass through.

14. The display apparatus of claim 12, wherein the bonding member fills a gap between the plurality of printed circuit boards and the plurality of frames.

15. The display apparatus of claim 12, wherein the first printed circuit board and the second printed circuit board are not spaced apart from each other in the first direction.

16. A manufacturing method of a display apparatus comprising:
    arranging a plurality of printed circuit boards on which a plurality of light emitting diodes (LEDs) is mounted on a jig so that the jig faces the plurality of printed circuit boards, the jig including a jig hole;
    fixing the plurality of printed circuit boards to the jig by suctioning air through the jig hole;
    providing a chassis assembly on the plurality of printed circuit boards so that the chassis assembly faces the plurality of printed circuit boards;
    injecting a bonding member between the chassis assembly and the plurality of printed circuit boards; and
    bonding the chassis assembly to the plurality of printed circuit boards by curing the bonding member, wherein the plurality of printed circuit boards comprises a first printed circuit board and a second printed circuit board arranged in a line in a second direction perpendicular to a first direction in which the plurality of LEDs emits light, wherein the chassis assembly comprises a first frame configured to support the first printed circuit board and a second frame configured to support the second printed circuit board, and wherein a first distance in the first direction between the first printed circuit board and the first frame is different from a second distance in the first direction between the second printed circuit board and the second frame.

17. The manufacturing method of claim 16, wherein the chassis assembly comprises a chassis to which the first frame and the second frame are coupled.

18. The manufacturing method of claim 17, wherein the chassis assembly includes a hole passing through the chassis assembly, and the bonding member is injected between the plurality of printed circuit boards and the first frame and the second frame through the hole of the chassis assembly.

* * * * *